(12) United States Patent
Vert et al.

(10) Patent No.: US 10,921,619 B2
(45) Date of Patent: Feb. 16, 2021

(54) OPTICAL MODULATOR WITH REGION EPITAXIALLY RE-GROWN OVER POLYCRYSTALLINE SILICON

(71) Applicant: Cisco Technology, Inc., San Jose, CA (US)

(72) Inventors: Alexey V. Vert, Clifton Park, NY (US); Mark A. Webster, Bethlehem, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/351,079

(22) Filed: Mar. 12, 2019

(65) Prior Publication Data

US 2020/0292853 A1    Sep. 17, 2020

(51) Int. Cl.
| | |
|---|---|
| *G02B 6/10* | (2006.01) |
| *G02F 1/035* | (2006.01) |
| *G02B 6/12* | (2006.01) |
| *G02B 6/26* | (2006.01) |
| *G02B 6/42* | (2006.01) |
| *G02F 1/025* | (2006.01) |
| *G02B 6/132* | (2006.01) |
| *H01L 21/02* | (2006.01) |
| *H01L 21/20* | (2006.01) |

(52) U.S. Cl.
CPC ............. *G02F 1/025* (2013.01); *G02B 6/132* (2013.01); *H01L 21/02667* (2013.01); *H01L 21/2022* (2013.01); *G02B 2006/12142* (2013.01)

(58) Field of Classification Search
CPC .............. G02F 1/025; H01L 21/02667; H01L 21/2022; G02B 6/132; G02B 2006/12142
USPC ............................ 385/2, 14, 39, 40, 50, 131
See application file for complete search history.

(56) References Cited

U.S. PATENT DOCUMENTS

| | | |
|---|---|---|
| 6,845,198 B2 | 1/2005 | Montgomery et al. |
| 7,065,301 B2 | 6/2006 | Shastri et al. |
| 9,766,484 B2 | 9/2017 | Adams et al. |

(Continued)

OTHER PUBLICATIONS

PCT Notification of Transmittal of the International Search Report and the Written Opinion of the International Searching Authority, or the Declaration for Application No. PCT/US2020/021915 dated Jun. 22, 2020.

(Continued)

*Primary Examiner* — Kaveh C Kianni
*Assistant Examiner* — Hung Q Lam
(74) *Attorney, Agent, or Firm* — Patterson + Sheridan, LLP

(57) ABSTRACT

Embodiments provide for an optical modulator that includes a first silicon region, a polycrystalline silicon region; a gate oxide region joining the first silicon region to a first side of the polycrystalline region; and a second silicon region formed on a second side of the polycrystalline silicon region opposite to the first side, thereby defining an active region of an optical modulator between the first silicon region, the polycrystalline region, the gate oxide region, and the second silicon region. The polycrystalline silicon region may be between 0 and 60 nanometers thick, and may be formed or patterned to the desired thickness. The second silicon region may be epitaxially grown from the polycrystalline silicon region and patterned into a desired cross sectional shape separately from or in combination with the polycrystalline silicon region.

7 Claims, 7 Drawing Sheets

(56) References Cited

U.S. PATENT DOCUMENTS

2011/0211786 A1* 9/2011 Ushida ................. G02F 1/025
385/2
2017/0082877 A1 3/2017 Arimoto et al.
2018/0074349 A1* 3/2018 Fujikata ............... G02F 1/025

OTHER PUBLICATIONS

Ansheng Liu et al., "A High-Speed Silicon Optical Modulator Based on a Metal-Oxide-Semiconductor Capacitor," Nature, vol. 427, No. 6975, Feb. 1, 2004, pp. 615-618.
Witzens Jeremy, "High-Speed Silicon Photonics Modulators," IEEE, vol. 106, No. 12, Dec. 1, 2018, pp. 2158-2182.

* cited by examiner

OPTICAL MODULATOR WITH REGION EPITAXIALLY RE-GROWN OVER POLYCRYSTALLINE SILICON

TECHNICAL FIELD

Embodiments presented in this disclosure generally relate to Silicon-Insulator-Silicon Capacitors (SISCAPs). More specifically, embodiments disclosed herein provide for improvements to SISCAPs and the fabrication thereof via the incorporation of an additional silicon layer.

BACKGROUND

The performance characteristics of optical modulators that include a polycrystalline silicon (also referred to as Poly-Si) region may be negatively affected by parasitic or access resistances in the polycrystalline region, which is a function of the doping level and mobility of free carriers therein. Higher levels of doping, however, may negatively affect optical signal losses, and the mobility of the free carrier may be bounded by grain boundaries within the Poly-Si region and interfaces between the Poly-Si region and other regions of the optical modulator.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
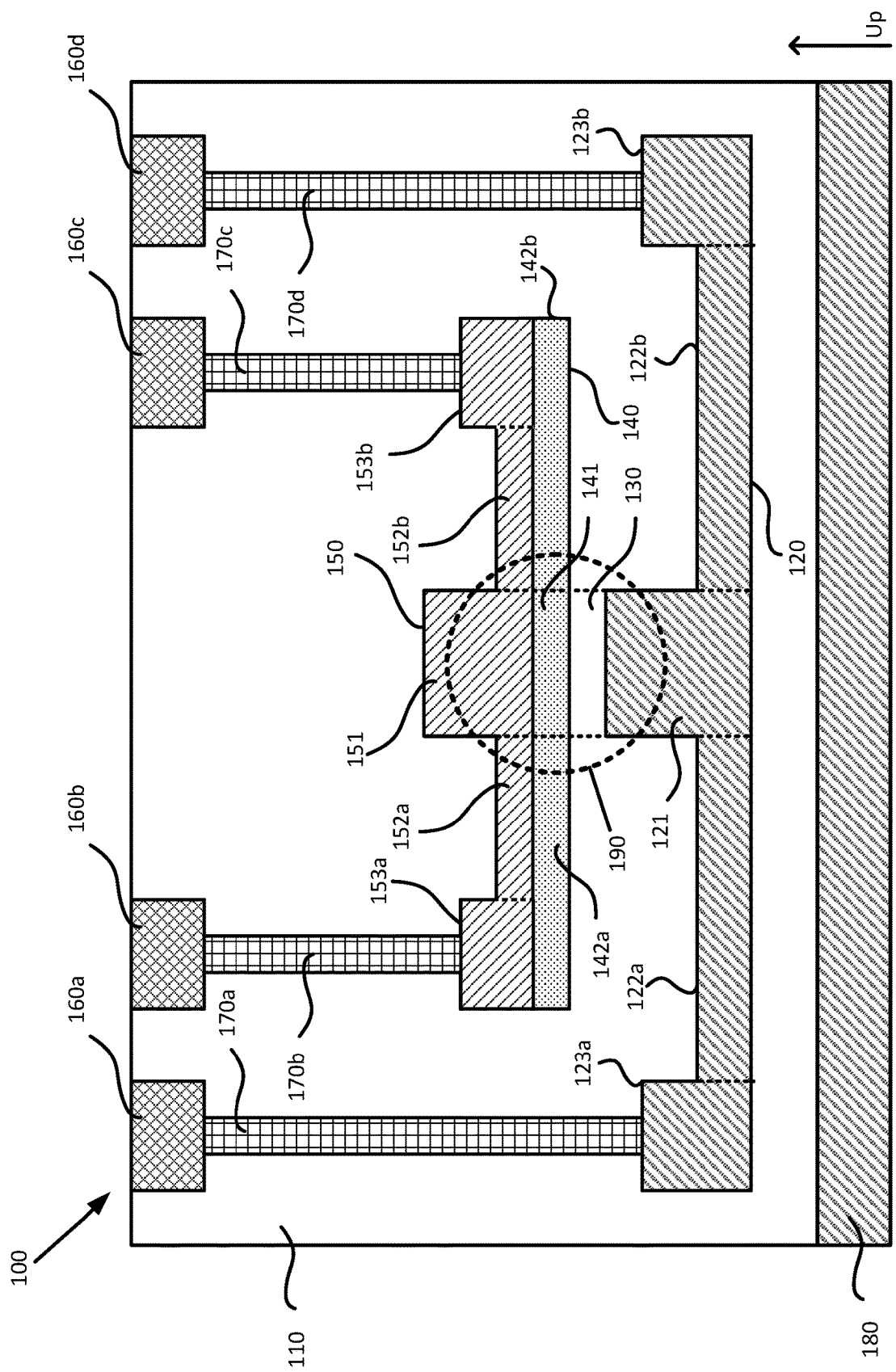
FIG. 1 illustrates a cross-section in a first plane of an optical modulator having a Poly-Si region from which a regrown Silicon region is formed, according to embodiments of the present disclosure.

One embodiment presented in this disclosure provides for an optical modulator, comprising: a first silicon region; a polycrystalline silicon region; a gate oxide region joining the first silicon region to a first side of the polycrystalline region; and a second silicon region grown on a second side of the polycrystalline silicon region opposite to the first side, thereby defining an active region of an optical modulator between the first silicon region, the polycrystalline region, the gate oxide region, and the second silicon region.

One embodiment presented in this disclosure provides for a method of forming an optical modulator, the method comprising: forming a polycrystalline layer of silicon on a silicon oxide insulator layer of a base component, wherein the base component includes a first silicon layer and a gate oxide layer of an optical modulator; thinning the polycrystalline layer of silicon into a desired cross-sectional shape; and epitaxially forming a second silicon layer on the polycrystalline layer, wherein the first silicon layer, the gate oxide layer, the polycrystalline layer and the second silicon layer define an active region for the optical modulator.

One embodiment presented in this disclosure provides for optical modulator, comprising: a first silicon region, including a silicon hub that extends a first height from an insulator, a first silicon wing that extends in a first direction from the silicon hub and at a second height from the insulator, and a second silicon wing that extends in a second direction from the silicon hub and at the second height from the insulator; a polycrystalline silicon region extending in parallel to the first silicon region, separated from the first silicon region by a gate oxide layer, the polycrystalline silicon region including a polycrystalline silicon hub that extends a third height from the insulator, a first polycrystalline silicon wing that extends in the first direction from the polycrystalline silicon hub and at a fourth height from the insulator, and a second polycrystalline silicon wing that extends in the second direction from the polycrystalline silicon hub and at the fourth height from the insulator; and a regrown silicon region extending in parallel to the polycrystalline silicon region, in contact with the polycrystalline silicon region and separated from the gate oxide layer by the polycrystalline silicon region, the regrown silicon region including a regrown hub that extends a fifth height from the polycrystalline silicon region, a first regrown wing that extends in the first direction from the regrown hub and at a sixth height from the polycrystalline silicon region, and a second regrown wing that extends in the second direction from the regrown hub and at the sixth height from the polycrystalline silicon region.

Example Embodiments

The present disclosure provides optical modulators, and methods of fabrication thereof, with improved operational characteristics including a silicon region that is re-grown from a polycrystalline silicon region. For example, in a semiconductor-insulator-semiconductor capacitor (also referred to as a SISCAP) a silicon region is separated from a Poly-Si region by an insulator (such as $SiO_2$). By removing some of the Poly-Si region and re-growing another silicon region on the remaining Poly-Si region, the resistances in the Poly-Si region are reduced (e.g., due to there being less material included in the active Poly-Si region) and the available bandwidth is increased (e.g., due to the potential grain size in the active Poly-Si region being reduced).

FIG. 1 illustrates a cross-section in a first plane of an optical modulator 100 having a Poly-Si region 140 from which a regrown Silicon region 150 is formed. The optical modulator 100 includes an insulator 110, such as $SiO_2$, which may be grown or deposited on a substrate 180, such as a Silicon wafer, and in which the other components are encapsulated or captured. For purposes of discussion, terms such as "up" or "above" shall relate to features further from the substrate 180, and terms such as "under" or "below" shall refer to features closer to the substrate 180. For example, as illustrated in FIG. 1, the first silicon region 120 shall be understood to be located above the substrate 180 and below the Poly-Si region 140 regardless of the relative orientation of the optical modulator 100.

The first silicon region 120 (also referred to as the body region) is fabricated at a first distance above the substrate 180, and is separated from the Poly-Si region 140 by a gate oxide region 130. The first silicon region 120 includes a silicon hub 121 that extends upward from the substrate 180, two silicon wings 122a,b (generally, silicon wings 122) that extend outward from the silicon hub 121 in opposing directions, and two silicon interfaces 123a,b (generally, silicon interfaces 123). In some embodiments, the silicon hub 121 extends a first height from the substrate 180 and the silicon wings 122 extend a second, different height from the substrate 180; defining a ridge that projects upward from the first silicon region 120. In some embodiments, the silicon hub 121 and the silicon wings 122 extend a uniform height from the substrate 180 relative to one another. In some embodiments, at an end of the silicon wings 122 distal to the silicon hub 121, a corresponding silicon interface 123 of a third height is defined, that connects the first silicon region 120 with a via 170. Although FIG. 1 distinguishes the silicon hub 121 from the silicon wings 122 and silicon interfaces 123 via dashed lines, the first silicon region 120 is contiguous, and the silicon hub 121, the silicon wings 122, and silicon interfaces 123 are defined by relative heights and/or concentrations of dopants applied thereto.

In one embodiment, the first silicon region 120 is fabricated from a Silicon semiconductor material that may be doped with various dopants to affect the optical and electrical properties of the first silicon region 120, and the level of doping may vary in the silicon hub 121 from the silicon wings 122. For example, the first silicon region 120 may include a partially or fully depleted CMOS (Complementary Metal-Oxide Semiconductor) element, strained silicon, Silicon Germanium, monocrystalline silicon, etc. In various embodiments, the silicon wings 122 are doped with a higher concentration of the dopant(s) used in the first silicon region 120 than the silicon hub 121 is doped with. As will be appreciated, a first region may be described as being doped at a higher concentration than a second region, or the second region may be described as being doped at a lower concentration than the first region, interchangeably.

The Poly-Si region 140 (also referred to as the polycrystalline region) is fabricated at a second distance above the substrate 180, above the first silicon region 120. The Poly-Si region 140 includes a Poly-Si hub 141 and two Poly-Si wings 142a,b (generally, Poly-Si wings 142) that extend outward from the Poly-Si hub 141 in opposing directions. In some embodiments, the Poly-Si hub 141 has a greater height than the Poly-Si wings 142 and extends as a downward projecting ridge (i.e., towards the substrate 180) relative to the Poly-Si wings 142. In some embodiments, the Poly-Si hub 141 and the Poly-Si wings 142 extend a uniform height from the substrate 180 relative to one another. Although FIG. 1 distinguishes the Poly-Si hub 141 from the Poly-Si wings 142 via dashed lines, the Poly-Si region 140 is contiguous, and the Poly-Si hub 141 and the Poly-Si wings 142 are defined by relative heights and/or concentrations of dopants applied thereto.

The Poly-Si region 140 is fabricated from a polycrystalline Silicon material that may be doped with various dopants to affect the optical and electrical properties of the Poly-Si region 140, and the level of doping may vary in the Poly-Si hub 141 from the Poly-Si wings 142. In embodiments in which the Poly-Si region 140 is P doped, the first silicon region 120 is N doped, and in embodiments in which the Poly-Si region 140 is N doped, the first silicon region 120 is P doped. In various embodiments, the Poly-Si wings 142 are doped with a higher concentration of the dopant(s) used in the Poly-Si region 140 than the Poly-Si hub 141 is doped with.

The regrown Silicon region 150 (also referred to as the regrown region or the second silicon region) is fabricated on the upper surface of the Poly-Si region 140 (relative to the substrate 180). The regrown silicon region 150 includes a regrown hubs 151 two regrown wings 152a,b (generally, regrown wings 152) that extend outward from the regrown hub 151 in opposing directions, and two regrown interfaces 153a,b (generally, regrown interfaces 153). In some embodiments, the regrown hub 151 has a greater height than the regrown wings 152, and extends upwards (i.e., away from the substrate 180) relative to the regrown wings 152; defining a ridge that projects upward from the regrown silicon region 150. In some embodiments, the regrown hub 151 and the regrown wings 152 extend a uniform height from the Poly-Si region 140 relative to one another. Each regrown wing 152 is connected to the regrown hub 151 on one end, and to a regrown interface 153 at the other end. The regrown interfaces 153 extend upward relative to the regrown wings 152, and may extend upward further than, the same as, or less than the regrown hub 151 in various embodiments.

Although FIG. 1 distinguishes the various regions (e.g., regrown hub 151, the regrown wings 152, regrown interfaces 153) via dashed lines, the regrown region 150 is contiguous, and the regrown hub 151, the regrown wings 152, and regrown interfaces 153 are defined by relative heights and/or concentrations of dopants applied thereto.

The regrown silicon region 150 is fabricated from a Silicon semiconductor material that may be doped with various dopants to affect the optical and electrical properties of the regrown silicon region 150, and the level of doping may vary in the regrown hub 151 from the regrown wings 152 and regrown interfaces 153. In some embodiments, the regrown silicon region 150 may include a partially or fully depleted CMOS (Complementary Metal-Oxide Semiconductor) element, strained silicon, Silicon Germanium, monocrystalline silicon, etc. In various embodiments, the regrown region 150 is epitaxially grown from the Poly-Si region 140 and shares the P/N doping characteristics with the Poly-Si region 140 or may remain individually doped. In various embodiments, the regrown wings 152 and regrown interfaces 153 are doped with a higher concentration of the dopant(s) used in the regrown silicon region 150 than the regrown hub 151 is doped with. The regrown interfaces 153 provide contact points for the regrown Silicon region 150 with the vias 170, and in various embodiments may be doped with the same or a different concentration of dopants than the regrown wings 152. Together with the Poly-Si region 140, the regrown silicon region 150 forms a gate region for the optical modulator 100.

The gate oxide region 130 separates the first silicon region 120 from the Poly-Si region 140 between the respective silicon hub 121 and the Poly-Si hub 141. The gate oxide region 130 may be a thin layer of the insulator 110 or a different material that forms the dielectric of the optical modulator 100. In various embodiments, the gate oxide region 130 is formed from several layers of materials including: Silicon Dioxide, Silicon Oxy-Nitride, various high-k dielectrics (including Hafnium and Zirconium based films), Aluminum Oxide, among others. Although FIG. 1 distinguishes the gate oxide region 130 from the insulator 110 via dashed lines, the gate oxide region 130 may be contiguous with the insulator 110, and is defined by the dopants/materials applied thereto or the relative positions of the silicon hub 121, Poly-Si hub 141, and regrown hub 151. The silicon hub 121, gate oxide region 130, Poly-Si hub 141, and regrown hub 151 collectively form an active region 190 for an active waveguide (directing light into or out of the page relative to the view illustrated in FIG. 1). The gate oxide region 130 provides for the efficient transport of carriers into and out of the first silicon region 120 and the Poly-Si region 140 when an electric field is applied across the contact pads 160a-d (generally, contact pads 160) of the optical modulator 100 to bias the optical modulator 100 and affect/modulate optical signals applied thereto.

The contact pads 160 are metallizations on a surface of the optical modulator 100 that allow for external devices to be electrically connected to various layers of the optical modulator 100 through vertical electrical connectors, such as the illustrated vias 170a-d (generally, vias 170). Although illustrated in FIG. 1 on an upper surface of the optical modulator 100, in other embodiments, one or more contact pads 160 may be located on different surfaces of the optical modulator 100, such as an underside of the substrate 180. Additionally, although illustrated as direct traces from the contact pads 160 to the various wings of the regions, in various embodiments, a via 170 may be a Through Silicon Via (TSV) that runs from a contact pad 160 on one surface to a corresponding contact pad 160 on an opposite surface of the optical modulator 100, to allow multiple contact points for external electrical devices to connect to the region that the via 170 runs through.

FIGS. 2-6 illustrate different stepwise fabrication options for an optical modulator 100 according to embodiments of the present disclosure. The relative sizes and shapes of the various layers used in FIGS. 2-6 are provided for illustrative purposes, and are not limiting as to the actual thickness and sizes of the layers relative to one another. In various embodiments, the Poly-Si region 140 is patterned to have a thickness in a range between 0-60 nanometers (nm) (±10%), although a Poly-Si wing 142 may be patterned to have a thickness less than a corresponding Poly-Si hub 141. For example, a Poly-Si region 140 may have Poly-Si wings 142 patterned to have thicknesses between a range of 10-20 nm, and the Poly-Si hub 141 with a thickness between a range of 20-40 nm.

Figure 2:
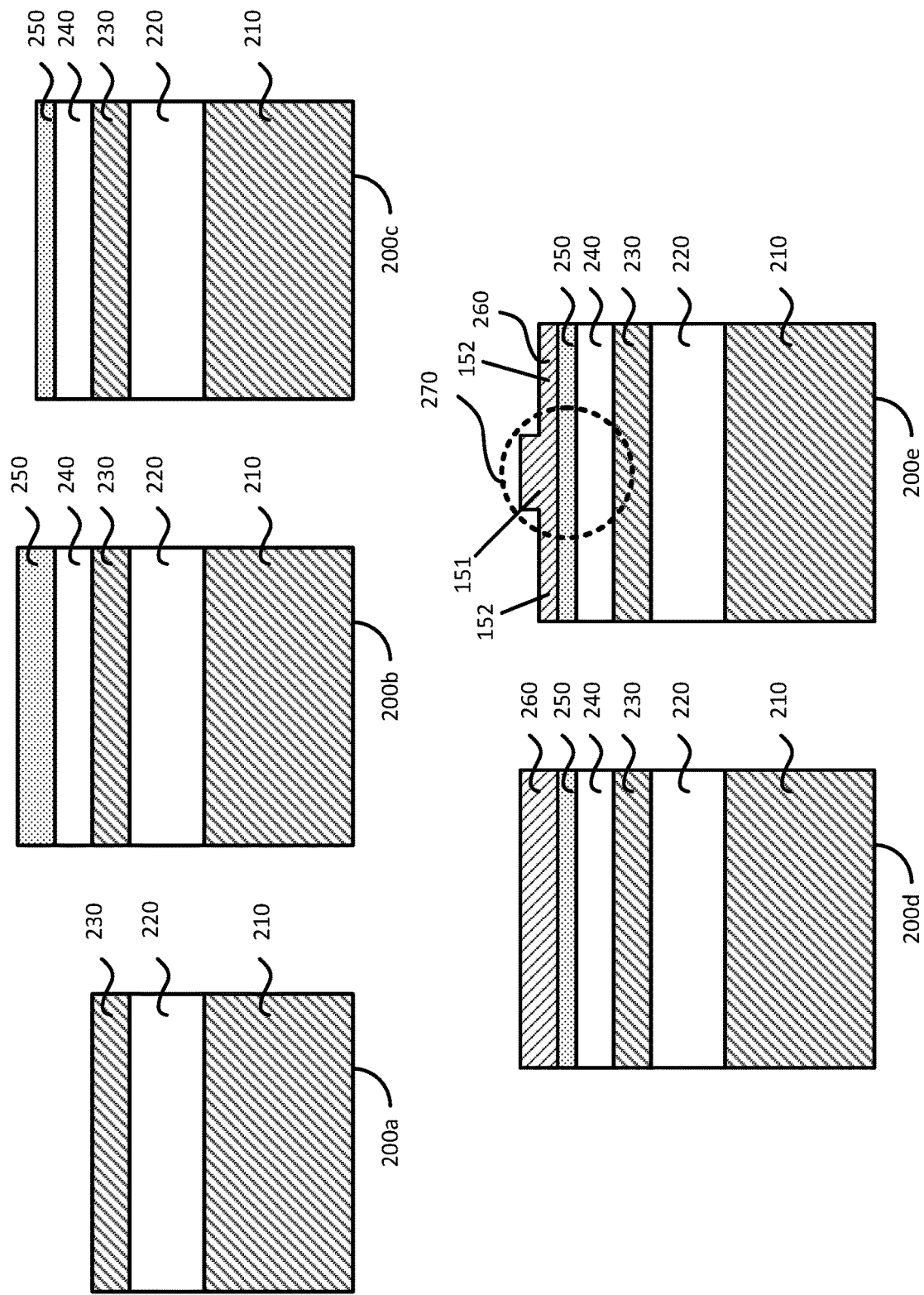
FIG. 2 illustrates the layered formation of components of an optical modulator with a winged modulator region with a broad gate to form an active region, according to embodiments of the present disclosure.

FIG. 2 illustrates the layered formation of components 200a-d of an optical modulator 100 with a winged modulator region with a broad gate to form an active region 270. In FIG. 2, a first component 200a includes a silicon substrate 210, a Buried Oxide (BOX) layer 220, and a first silicon layer 230, which may correspond to the substrate 180, (a portion of) the insulator 110, and the first silicon region 120 of FIG. 1, respectively. A fabricator may fabricate or otherwise use a wafer corresponding to the first component 200a as a base component for fabricating optical modulators 100 on a wafer-level scale.

The fabricator forms a second oxide layer 240 above the first silicon layer 230, and forms a Poly-Si layer 250 of a first thickness above the second oxide layer 240 to create the second component 200b from the first component 200a. To form the third component 200c, the fabricator trims the Poly-Si layer 250 of the second component 200b to a new, desired height. In various embodiments, the second oxide layer may correspond to the gate oxide region 130 and/or the insulator 110 of FIG. 1, and the Poly-Si layer 250 corresponds to the Poly-Si region 140 of FIG. 1. In various embodiments, the fabricator may use various chemical or physical polishing and etching processes to trim the Poly-Si layer 250 from the first height to the second height.

Once the Poly-Si layer 250 is trimmed to the desired height, the fabricator epitaxially grows a second silicon layer 260 on the Poly-Si layer 250. In various embodiments, the second silicon layer 260 corresponds to the regrown silicon region 150 of FIG. 1. The fabricator may pattern, etch, and planarize the second silicon layer 260 into a desired shape to thereby form the fifth component 200e from the fourth component 200d. As illustrated in FIG. 2, the fabricator has imparted a winged shaped to the second silicon layer 260, in which a regrown hub 151 extends a greater height above the Poly-Si layer 250 than the corresponding regrown wings 152.

The fabricator may then form various contact pads 160, vias 170, and encapsulate and passivate the active layers in additional insulator material in the fifth component 200e to form an optical modulator 100.

Figure 3:
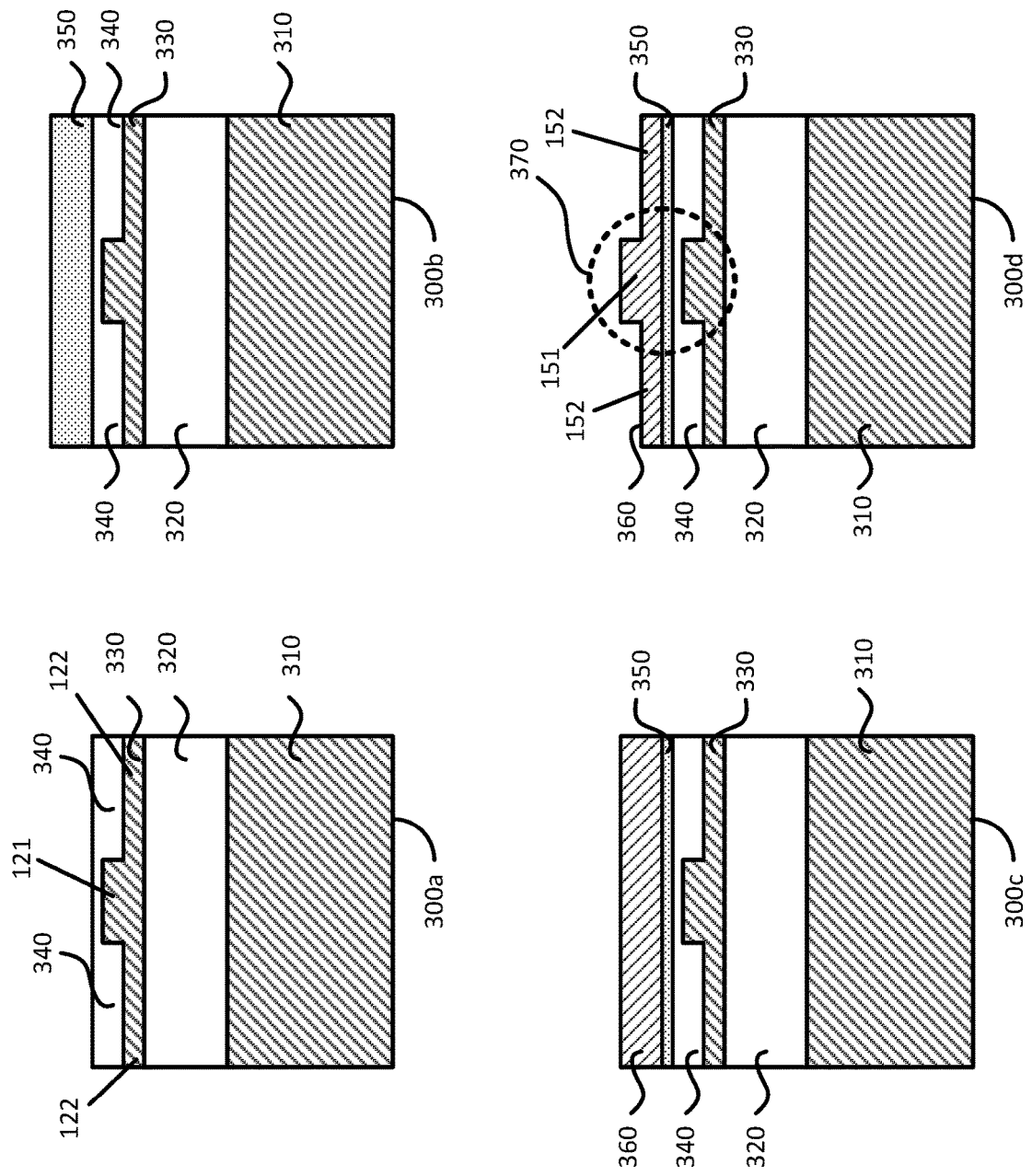
FIG. 3 illustrates the layered formation of components of an optical modulator with a winged modulator region with a narrow gate to form an active region, according to embodiments of the present disclosure.

FIG. 3 illustrates the layered formation of components 300a-d of an optical modulator 100 with a winged modulator region with a narrow gate to form an active region 370. In FIG. 3, a first component 300a includes a silicon substrate 310, a first BOX layer first 320, a first silicon layer 330, and a second BOX layer 340 which may correspond to the substrate 180, (a portion of) the insulator 110, the first silicon region 120, and (a portion of) the insulator 110 and the gate oxide region 130 of FIG. 1, respectively. A fabricator may fabricate or otherwise use a wafer corresponding to the first component 300a as a base component for fabricating optical modulators 100 on a wafer-level scale. Unlike the broad gated winged modulator in FIG. 2, which includes a first silicon layer 230 with a silicon hub 121 of a shared height to the silicon wings 122, the narrow gated winged modulator of FIG. 3 includes a first silicon layer 330 with a silicon hub 121 of a greater height than the corresponding silicon wings 122.

The fabricator forms a Poly-Si layer 350 of a first thickness above the second BOX layer 340 of the first component 300a to form the second component 300b. To form the third component 300c, the fabricator trims the Poly-Si layer 350 of the second component 300b to a new, desired height, and epitaxially grows a second silicon layer 360 on the Poly-Si layer 350. In various embodiments, the Poly-Si layer 350 and the second silicon layer 360 correspond to the Poly-Si region 140 and regrown silicon region 150 of FIG. 1, respectively. In various embodiments, the fabricator may use various chemical or physical polishing and etching processes to trim the Poly-Si layer 350 from the first height to a desired second height.

Once the Poly-Si layer 250 is trimmed to the desired height, the fabricator may pattern, etch, and planarize the second silicon layer 360 into a desired shape to thereby form the fourth component 300d from the third component 300c. For example, the second silicon layer 360 may be trimmed to a new, desired height to be planar, or as illustrated in FIG. 3, may be selectively trimmed to provide a regrown hub 151 and regrown wings 152. The fabricator may then form various contact pads 160, vias 170, and encapsulate and passivate the active layers in additional insulator material.

Figure 4:
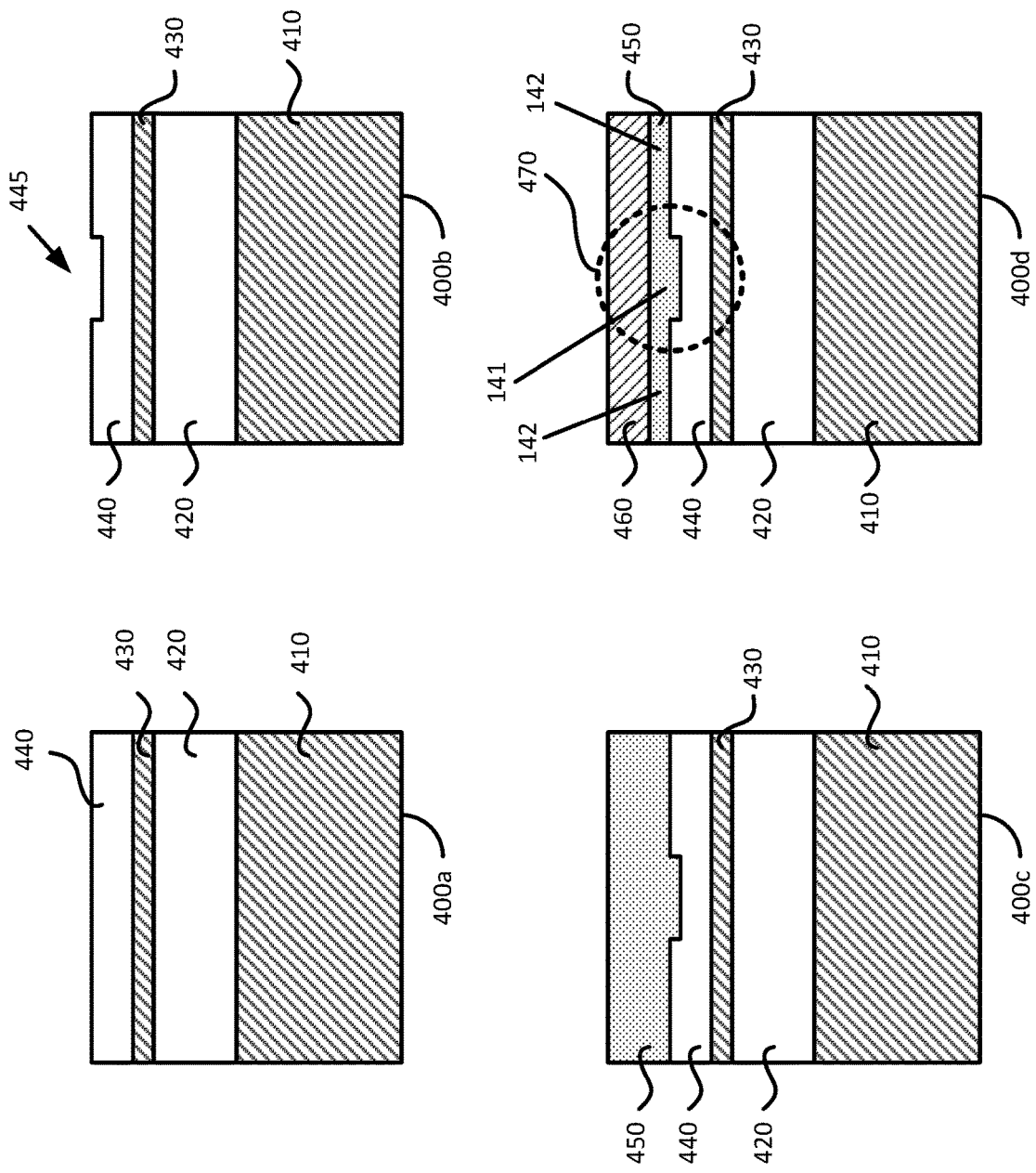
FIG. 4 illustrates the layered formation of components of an optical modulator with an inverted winged modulator region with a broad gate to form an active region, according to embodiments of the present disclosure.

FIG. 4 illustrates the layered formation of components 400a-d of an optical modulator 100 with an inverted winged modulator region with a broad gate to form an active region 470. In FIG. 4, a first component 400a includes a silicon substrate 410, a first BOX layer first 420, a first silicon layer 430, and a second BOX layer 440 which may correspond to the substrate 180, (a portion of) the insulator 110, the first silicon region 120, and (a portion of) the insulator 110 and the gate oxide region 130 of FIG. 1, respectively. A fabricator may fabricate or otherwise use a wafer corresponding to the first component 400a as a base component for fabricating optical modulators 100 on a wafer-level scale. Unlike the broad gated winged modulator region illustrated in FIG. 2, which includes a planar Poly-Si layer 250, the inverted winged modulator region illustrated in FIG. 3 defines a Poly-Si layer 450 with a Poly-Si hub 141 that projects downward (i.e., towards the silicon substrate 410) relative to the corresponding Poly-Si wings 142.

The fabricator forms the second component 400b from the first component 400a by etching a slot 445 into the second BOX layer 440 using use various chemical or physical etching processes. When the fabricator forms a Poly-Si layer 450 above the second BOX layer 440 to form the third component 400c from the second component 400b, the slot 445 is filled with the Poly-Si material and defines the downward projecting Poly-Si hub 141.

To form the fourth component 400d from the third component 400c, the fabricator trims the Poly-Si layer 450 to a desired height, and epitaxially grows a second silicon layer 460 on the Poly-Si layer 450. In various embodiments, the Poly-Si layer 450 and the second silicon layer 460 correspond to the Poly-Si region 140 and regrown silicon region 150 of FIG. 1, respectively. In various embodiments, the fabricator may use various chemical or physical polishing and etching processes to trim the Poly-Si layer 450 from the first height to a second height.

Once the Poly-Si layer 450 is trimmed to the desired height, the fabricator may pattern, etch, and planarize the second silicon layer 460 into a desired shape. The fabricator may then form various contact pads 160, vias 170, and encapsulate and passivate the active layers in additional insulator material.

Figure 5:
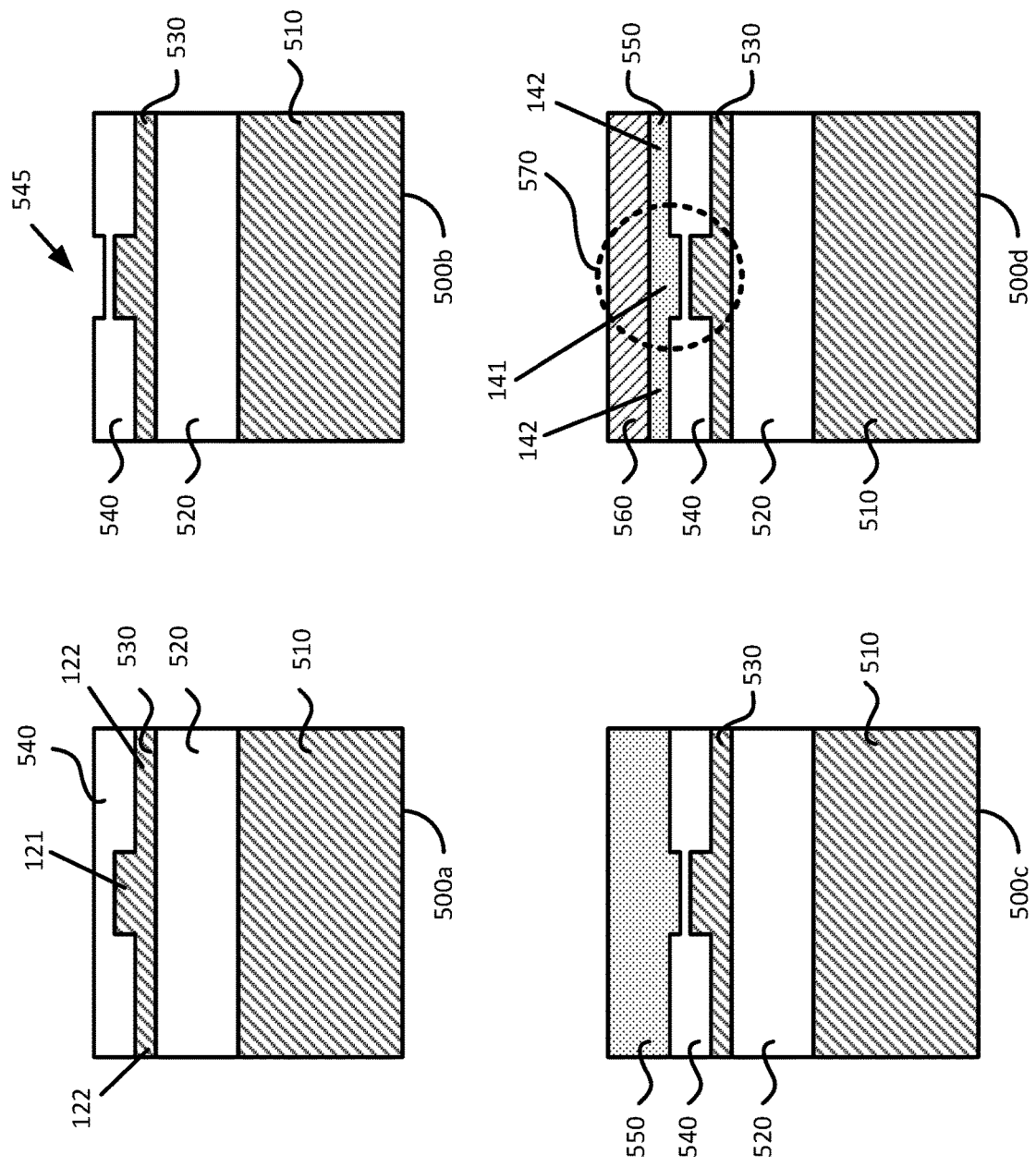
FIG. 5 illustrates the layered formation of components of an optical modulator with an inverted winged modulator region with a narrow gate to form an active region, according to embodiments of the present disclosure.

FIG. 5 illustrates the layered formation of components 500a-d of an optical modulator 100 with an inverted winged modulator region with a narrow gate to form an active region 570. In FIG. 5, a first component 500a includes a silicon substrate 510, a first BOX layer 520, a first silicon layer 530, and a second BOX layer 540 which may correspond to the substrate 180, (a portion of) the insulator 110, the first silicon region 120, and (a portion of) the insulator 110 and the gate oxide region 130 of FIG. 1, respectively. A fabricator may fabricate or otherwise use a wafer corresponding to the first component 500a as a base component for fabricating optical modulators 100 on a wafer-level scale. Unlike the broad gated inverted winged modulator region illustrated in FIG. 4, which includes a planar first silicon layer 430, the inverted winged modulator region illustrated in FIG. 5 defines a first silicon layer 530 that includes a silicon hub 121 that projects upwards (i.e., away from the silicon substrate 410) relative to the corresponding silicon wings 122.

The fabricator forms the second component 500b by etching a slot 545 into the second BOX layer 540 of the first component 500a using use various chemical or physical etching processes. When the fabricator forms a Poly-Si layer 550 above the second BOX layer 540 to form the third component 500c from the second component 500b, the slot 545 is filled with the Poly-Si material and defines the downward projecting portion of the Poly-Si hub 141 in the slot 545.

To form the fourth component 500d, the fabricator trims the Poly-Si layer 550 of the third component 500c to a desired height, thus defining the heights for the Poly-Si hub 141 and the Poly-Si wings 142 on which the fabricator grows a second silicon layer 560. In various embodiments, the Poly-Si layer 550 and the second silicon layer 560 correspond to the Poly-Si region 140 and regrown silicon region 150 of FIG. 1, respectively. In various embodiments, the fabricator may use various chemical or physical etching processes to trim the Poly-Si layer 550 from the first height to a second height.

Once the Poly-Si layer 550 is trimmed to the desired height, the fabricator may pattern, etch, and planarize the second silicon layer 560 into a desired shape. The fabricator may then form various contact pads 160, vias 170, and encapsulate and passivate the active layers in additional insulator material.

Figure 6:
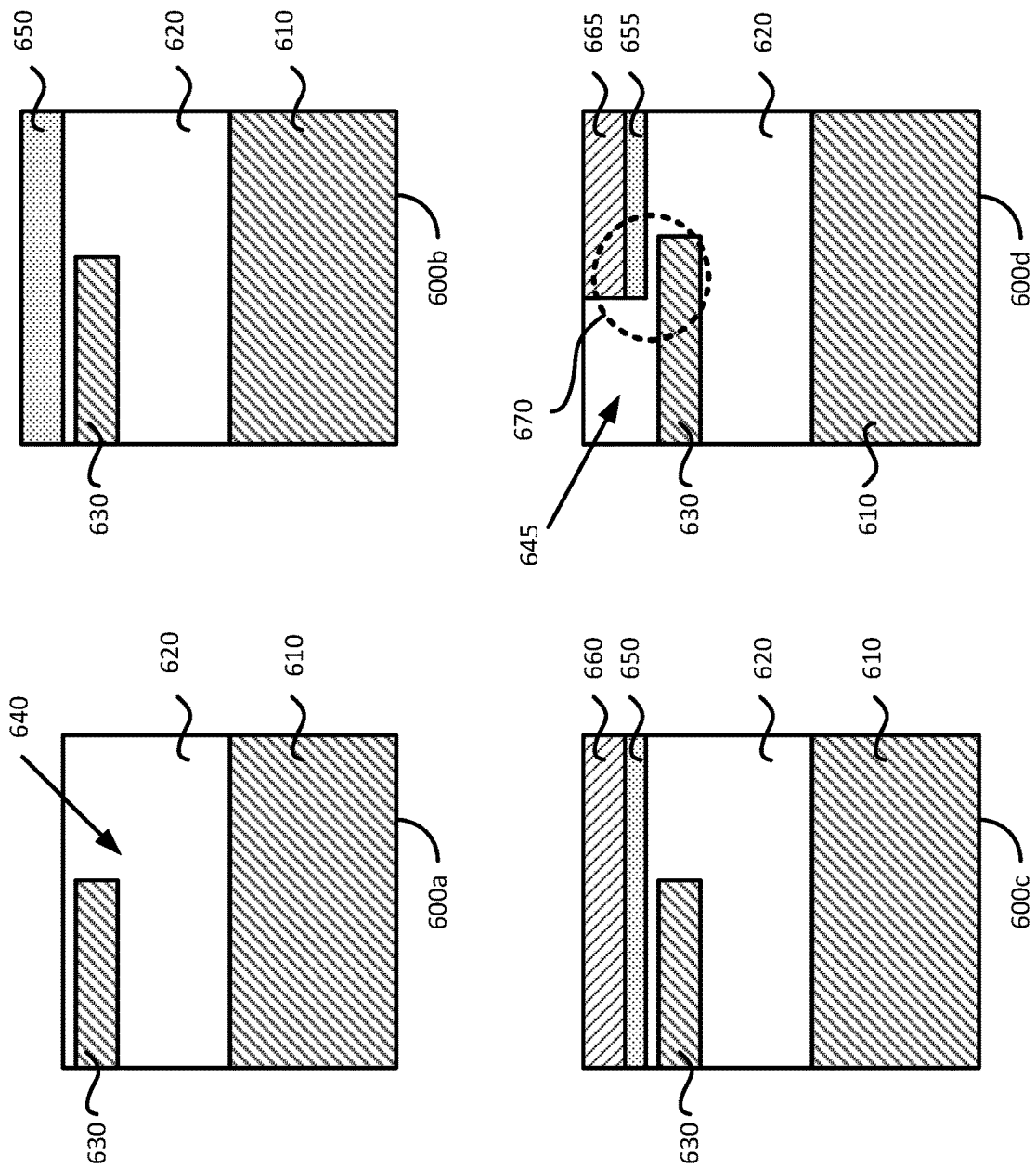
FIG. 6 illustrates the layered formation of components of an optical modulator with a two-plate modulator region to form an active region, according to embodiments of the present disclosure.

FIG. 6 illustrates the layered formation of components 600a-d of an optical modulator 100 with a two-plate modulator region to form an active region 670. In some embodiments, the cross sectional views of the components 600a-d in FIG. 6 represent a cross sectional plane of view perpendicular to the cross sectional planes of view illustrated in FIGS. 1-5 (e.g., a ZX plane compared to a ZY plane). In some embodiments, the cross sectional views of the components 600a-d in FIG. 6 represent a cross sectional plane of view parallel or coplanar to the cross sectional planes of view illustrated in FIGS. 1-5.

In FIG. 6, a first component 600a includes a silicon substrate 610, a BOX layer 620, and a first silicon plate 630, which may correspond to the substrate 180, the insulator 110 and gate oxide region 130, and the first silicon region 120 of FIG. 1, respectively. The BOX layer 620 includes an insulator portion 640 that is coplanar with the first silicon plate 630; unlike the modulators illustrated in FIGS. 2-5, the first silicon plate 630 does not extend across the cross-sectioned plane of the components 600a-d. The BOX layer 620 extends for a first length, and encapsulates the first silicon plate 630 at a first height from the silicon substrate 610, which extends for a second length (that is less than the first length) from a first side of the BOX layer 620 to a center of the components 600a-d. A fabricator may fabricate or otherwise use a wafer corresponding to the first component 600a as a base component for fabricating optical modulators 100 on a wafer-level scale.

The fabricator forms the second component 600b from the first component 600a by forming a Poly-Si layer 650 above the BOX layer 620 at a second height above the silicon substrate 610. To form the third component 600c from the second component 600b, the fabricator patterns the Poly-Si layer 650 to a desired height, and the fabricator may use various chemical or physical etching processes to trim the Poly-Si layer 550 from the first height to a second height. Once patterned, the fabricator epitaxially grows a regrown silicon layer 660 on the Poly-Si layer 650. In various embodiments, the Poly-Si layer 650 and the regrown silicon layer 660 correspond to the Poly-Si region 140 and regrown silicon region 150 of FIG. 1, respectively.

To form the fourth component 600d from the third component 600c, the fabricator patterns the Poly-Si layer 650 and the silicon layer 660 into a Poly-Si plate 655 and a regrown silicon plate 665 respectively. The Poly-Si plate 655 and the regrown silicon plate 665 do not extend across the cross-sectioned plane of the fourth components 600d, but extend partially across the length of the BOX layer 620 to vertically overlap with at least a portion of the first silicon plate 630, to form the active region 670 therebetween. Stated differently, the Poly-Si plate 655 and the regrown silicon plate 665 extend from the center of the fourth component 600d (to which the first silicon plate 630 extends) in an opposite direction from which the silicon plate 630 extends. The fabricator also expands the BOX layer 620 to at least to the height of the second silicon plate 665. The fabricator may then form various contact pads 160, vias 170, and encapsulate and passivate the active layers in additional insulator material.

Figure 7:
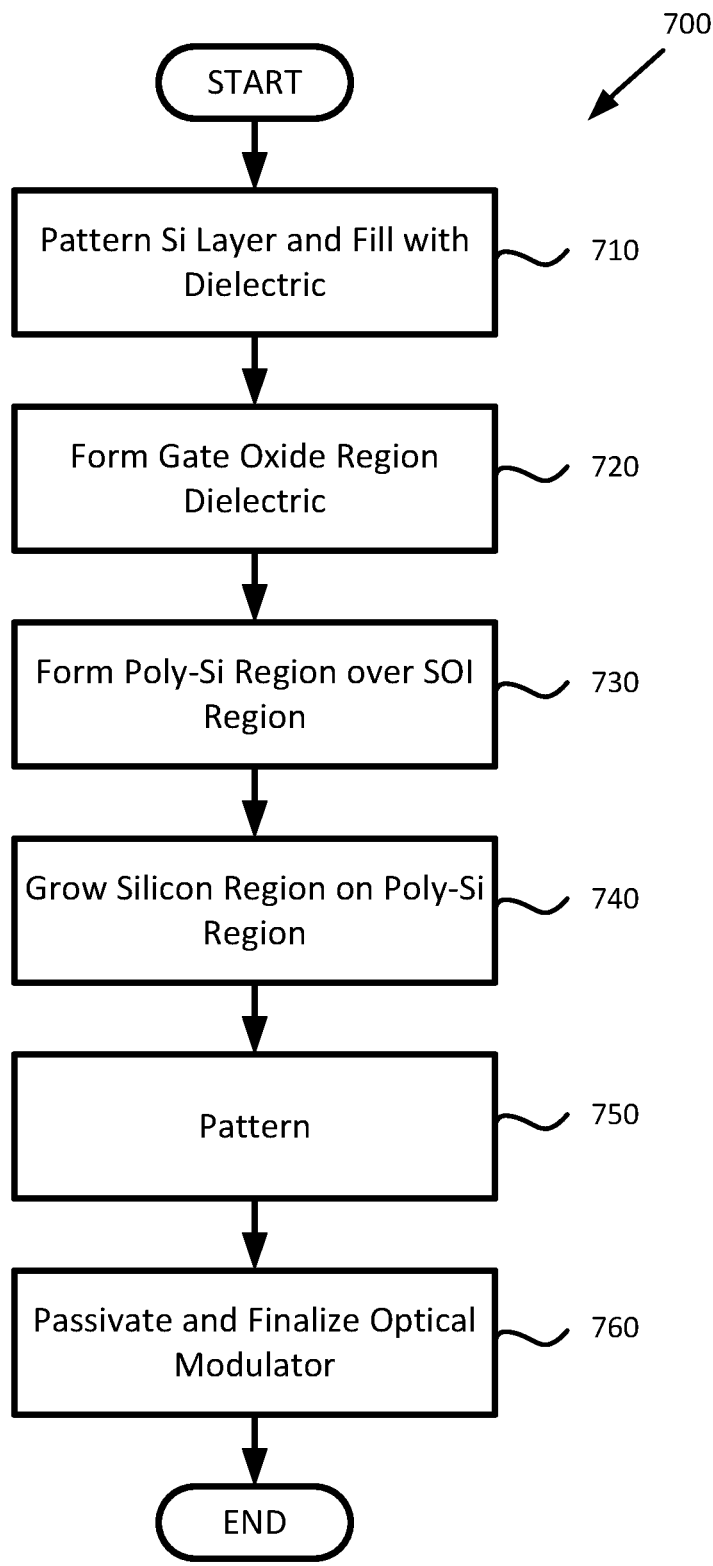
FIG. 7 is a flowchart of a method for producing an optical modulator with a regrown region that is epitaxially re-grown over polycrystalline silicon region, according to embodiments of the present disclosure.

FIG. 7 is a flowchart of a method 700 for producing an optical modulator 100 with a regrown region 150 that is epitaxially re-grown over a polycrystalline silicon region 140. Method 700 begins at block 710, where a fabricator patterns a first layer of Silicon on a base component for the optical modulator 100 and fills the patterned Silicon region 120 with a dielectric. In various embodiments, the fabricator forms the base component from a silicon substrate (such as a wafer) to include an insulator (such as $SiO_2$) over which a silicon region 120 is formed, thus forming a Silicon On Insulator (SOI) region, from which further formation of the optical modulator 100 is based. In some embodiments, the silicon region 120 is of a uniform height (e.g., as per the first silicon layer 230 in component 200a in FIG. 2), while in other embodiments, the silicon region 120 includes a silicon hub 121 and silicon wings 122 of differing heights (e.g., as per the first silicon layer 330 in FIG. 3).

The silicon region 120 may be doped with various dopants with different concentrations at different portions of the silicon region 120 (e.g., N doped with a first dopant concentration in the silicon wings 122 and a second dopant concentration in the silicon hub 121). In various embodiments, the silicon region 120 is doped with different concentrations of dopants at different locations by applying various masks to the semiconductor material during formation. In various embodiments, the base component extends to cover and encapsulate the silicon regions 120, and may encapsulate the silicon region 120 with a planar surface (e.g., as per second oxide layer 240 in FIG. 2) or with a surface defining a slot for the growth of a Poly-Si hub 141 (e.g., as per second BOX layer 440 with slot 445 in FIG. 4).

At block 720, the fabricator forms the dielectric of the gate oxide region 130 over the silicon hub 121. The gate oxide region 130 may be formed from one or more thin layers of various dielectrics, such as, for example: Silicon Dioxide, Silicon Oxy-Nitride, various high-k dielectrics (including Hafnium and Zirconium high-k dielectric films), Aluminum Oxide high-k dielectric film, etc. The various layers may include one or more dopants.

At block 730, the fabricator forms a layer of Poly-Si material over the gate oxide region 130 and the SOI region. In various embodiments, the Poly-Si material forms a Poly-Si region 140 that is of a uniform height (e.g., as per Poly-Si layer 250 in FIG. 2) or that includes a Poly-Si hub 141 and Poly-Si wings 142 of differing heights (e.g., as per Poly-Si layer 450 in FIG. 4). The Poly-Si region 140 may be doped with various dopants with different concentrations at different portions of the Poly-Si region 140 (e.g., P doped with a first dopant concentration in the Poly-Si wings 142 and a second dopant concentration in the Poly-Si hub 141). In various embodiments, the Poly-Si region 140 is doped with different concentrations of dopants at different locations by applying various masks to the Poly-Si material during formation. In various embodiments, the fabricator forms the Poly-Si region 140 at a first height and trims or patterns the Poly-Si region 140 into a desired height. In various embodiments, the desired height of the Poly-Si region 140 is selected to be between 0-20 nm, 20-40 nm, 40-60 nm, 0-40 nm, 20-60 nm, or 0-60 nm according to a desired manufacturing tolerance. The Poly-Si region 140 is doped to exhibit a different conductivity type than the silicon region 120, for example, the Poly-Si region 140 is N-doped when the silicon region 120 is P-doped, and vice versa.

The exposed surface of the patterned/trimmed Poly-Si region 140 provides a material matrix on which the fabricator epitaxially grows a second silicon region (i.e., the regrown silicon region 150) at block 740. The regrown silicon region 150 may be doped with various dopants with different concentrations at different portions of the regrown silicon region 150 (e.g., P doped with a first dopant concentration in the regrown wings 152 and regrown interfaces 153, and a second dopant concentration in the regrown hub 151). In various embodiments, the regrown silicon region 150 is doped with different concentrations of dopants at different locations by applying various masks to the semiconductor material during formation. The regrown silicon region 150 is doped to exhibit the same conductivity type as the Poly-Si region 140, for example, the regrown silicon region 150 is N-doped when the Poly-Si region 140 is N-doped, and the regrown silicon region 150 is P-doped when the Poly-Si region 140 is P-doped, although the regrown silicon region 150 and the Poly-Si region 140 may be doped with different dopants and at different concentrations.

At block 750, the fabricator patterns the second silicon region 150 into a desired cross-sectional shape (e.g., defining a regrown hub 151 and/or regrown interfaces 153 of various heights relative to the regrown wings 152). In some embodiments, the fabricator patterns the regrown silicon region 150 at block 750, shaping the silicon region into a uniform desired height (e.g., as per the second silicon layer 460 in FIG. 4) or into differing desired heights for the regrown hub 151 and regrown wings 152 (e.g., as per the second silicon layer 260 in FIG. 2). In some embodiments, the fabricator patterns the regrown silicon region 150 and the underlying Poly-Si region 140 at block 750, forming a second silicon plate 665 and a Poly-Si plate 655 respectively that run across a portion of the length of the optical modulator 100 to overlap vertically with a portion of the further underlying first silicon plater 630 or silicon region 120 to provide the active region for the optical modulator 100.

At block 760, the fabricator passivates and finalizes the optical modulator 100. In various embodiments, passivation includes encapsulating the active components that are not already encapsulated in an insulator material (e.g., the Poly-Si region 140 and regrown silicon region 150) in additional insulator material and patterning the insulator material to a desired height. Other finalization operations include, but at not limited to: the metallization of the optical modulator 100 (e.g., the formation of contact pads 160 and vias 170), dicing individual dies of an optical modulator 100 from a wafer, and incorporating the optical modulator 100 into an optoelectronic circuit. Method 700 may then conclude.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. An optical modulator, comprising:
a first silicon region, including a silicon hub that extends a first height from an insulator, a first silicon wing that extends in a first direction from the silicon hub and at a second height from the insulator, and a second silicon wing that extends in a second direction from the silicon hub and at the second height from the insulator;
a polycrystalline silicon region extending in parallel to the first silicon region, separated from the first silicon region by a gate oxide layer, the polycrystalline silicon region including a polycrystalline silicon hub that extends a third height from the insulator, a first polycrystalline silicon wing that extends in the first direction from the polycrystalline silicon hub and at a fourth height from the insulator, and a second polycrystalline silicon wing that extends in the second direction from the polycrystalline silicon hub and at the fourth height from the insulator; and
a regrown silicon region extending in parallel to the polycrystalline silicon region, in contact with the polycrystalline silicon region and separated from the gate oxide layer by the polycrystalline silicon region, the regrown silicon region including a regrown hub that extends a fifth height from the polycrystalline silicon region, a first regrown wing that extends in the first direction from the regrown hub and at a sixth height from the polycrystalline silicon region, and a second regrown wing that extends in the second direction from the regrown hub and at the sixth height from the polycrystalline silicon region.

2. The optical modulator of claim 1, wherein the first height is greater than the second height, such that the silicon hub projects from the first silicon wing and the second silicon wing toward the polycrystalline silicon region.

3. The optical modulator of claim 1, wherein the third height is greater than the fourth height, such that the polycrystalline silicon hub projects from the first polycrystalline silicon wing and the second polycrystalline silicon wing toward the first silicon region.

4. The optical modulator of claim 1, wherein the fifth height is greater than the sixth height, such that the regrown hub projects from the first regrown wing and the second regrown wing away from the first silicon region.

5. The optical modulator of claim 1, wherein the first silicon region is N doped and the polycrystalline silicon region and the regrown silicon region are P doped, wherein the silicon hub is doped at a first lower concentration than the first silicon wing and the second silicon wing, wherein the polycrystalline silicon hub is doped at a second lower concentration than the first polycrystalline silicon wing, the second polycrystalline silicon wing, the first regrown wing, and the second regrown wing.

6. The optical modulator of claim 1, wherein the polycrystalline silicon region has a thickness in a range between 0 nanometers and 60 nanometers.

7. The optical modulator of claim 1, wherein a first contact is electrically connected to a first silicon interface of the first silicon wing distal to the silicon hub, a second contact is electrically connected to a second silicon interface of the second silicon wing distal to the first silicon hub, a third contact is electrically connected to a first regrown interface of the first regrown wing distal to the regrown hub, and a fourth contact is electrically connected to a second regrown interface of the second regrown wing distal to the regrown hub.

* * * * *